United States Patent [19]
Hilbert

[11] 3,753,121
[45] Aug. 14, 1973

[54] VARIABLY BIASED AUDIO AMPLIFIER

[75] Inventor: Francis H. Hilbert, Addison, Ill.

[73] Assignee: Motorola, Inc., Franklin Park, Ill.

[22] Filed: May 3, 1971

[21] Appl. No.: 139,474

[52] U.S. Cl. .................. 325/319, 325/408, 325/409, 325/411, 325/425, 330/22, 330/40

[51] Int. Cl. .............................................. H04b 1/16

[58] Field of Search .................... 325/319, 403, 409, 325/485, 408, 409, 411, 425; 330/29, 181, 187, 19, 23, 29, 129, 22, 25, 40, 135, 136, 140, 191

[56] References Cited

UNITED STATES PATENTS 3,514,710 5/1970 Janning ................................ 330/29
3,559,088 1/1971 Booth et al. .......................... 330/25
3,469,195 9/1969 Harwood ............................ 325/408

*Primary Examiner*—Albert J. Mayer
*Attorney*—Vincent Rauner and H. Olsen

[57] ABSTRACT

There is disclosed an audio amplifying output circuit for a receiver which includes biasing means for operating the output transistor to a minimum operating current level. The circuit is DC coupled to the preceeding stage as for example, the IF detector stage, so as to receive the DC component of the detected carrier signal. The DC component of the detected carrier signal is applied directly to the base of the transistor to increase its collector current in accordance with the amplitude of the driving signal thereby preventing transistor cut-off when signals of higher levels are received thereby.

3 Claims, 2 Drawing Figures

INVENTOR:
FRANCIS H. HILBERT
BY: ATTY.

VARIABLY BIASED AUDIO AMPLIFIER

BACKGROUND OF THE INVENTION

This invention relates to an audio amplifier and more particularly to an audio amplifier which is variably biased so as to draw only sufficient current to maintain operation.

The audio output stage or stages of a conventional receiver are normally biased from a fixed voltage source as through a resistor divider network applied to the base of the transistor amplifier, from a supply voltage. The resistor divider network is so proportioned that the bias voltage provides a collector current which, when heavily modulated from approximately zero current to approximately three current, assures the desired output power without premature clipping of one of the peaks of the AC signal. This results in a maximization of the dynamic range and hence maximization of the audio output. However, low AC voltage signals do not require such a relatively heavy bias current to effect amplification without clipping,hence, more collector current flows during the entire operation of the amplifier than is normally necessary for the average output signal. It is a primary object of this invention to provide an audio output amplifier which is more economic in its utilization of power throughout overall operation of the receiver. A further object of the invention is to provide a variable bias such that the output stage draws only a minimum amount of current required for any given AC output voltage.

In the conventional receiver some form of a DC component proportional to or developed from the input signal is utilized to provide feedback for AGC (automatic gain control). DC isolation is normally provided between the IF stages and the audio output so that this DC component does not appear in the audio output.

SUMMARY

In accordance with this invention, the audio output stage is directly coupled to the detector of the IF stage so as to permit a DC component proportional to the input signal to vary the bias on the amplifier stage and prevent it from saturating upon reception of large AC voltage signals and to vary its power delivering capability in accordance with the signal level presented to it.

Further objects and advantages of the invention will be apparent from the following complete description thereof.

THE DRAWINGS

FIG. 1 is a circuit schematic of an audio output amplifier in accordance with a preferred embodiment of the invention; and FIG. 2 is a schematic illustration of another embodiment thereof wherein further power amplification is derived in the output stage.

DETAILED DESCRIPTION

Figure 1:
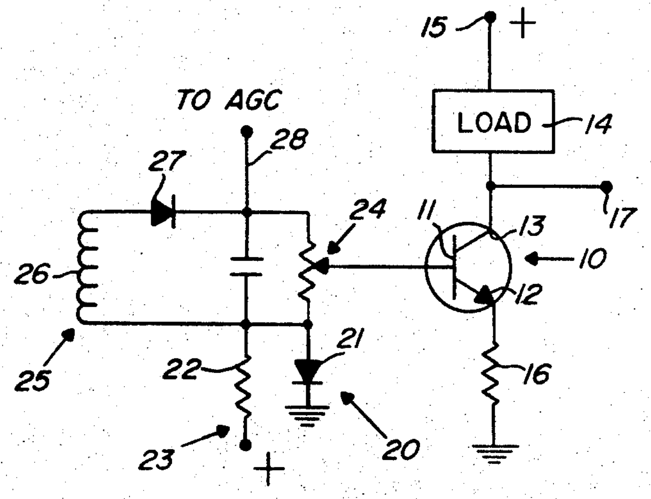

Referring more particularly to FIG. 1 of the drawings there is shown an audio output amplifier comprising a transistor 10 having a base 11, an emitter 12 and a collector 13. By way of example, the transistor is shown as being of the NPN type but of course it could be of the PNP type with appropriate changes in the polarities of the biasing elements. The collector 13 is connected through a load 14 to a supply source 15, not shown. Source 15 as indicated is of positive polarity since as illustrated the transistor 10 is of the NPN type. The emitter 12 of the transistor 10 is connected to ground through a limiting resistor 16. The output signal is a drive from across the load through an output connector 17. In the usual case the load will be the output transformer to the speaker of the receiver.

The amplifying transistor 10 is made to operate at the minimum current required to prevent it from going into cutoff at any given carrier modulation level by a suitable biasing network 20. This minimum biasing level is set by the diode 21 which is connected by resistor 22 to a + supply source 23. The voltage set by the diode 21 is applied to the base 11 of the transistor 10 through a variable resistor 24. The input signal is applied to the base 11 of the transistor 10 from a portion of the detector circuit 25 of a standard IF stage of the receiver. The secondary 26 and diode 27 of the detector being depicted. The carrier voltage also may be directed to the AGC network through a conductor 28. Thus, the DC component of the detected carrier signal is applied not only to the AGC through conductor 28 as is standard but is also applied to the base 11 of the transistor 10 of the output amplifier. Of course it is also possible to drive the AGC voltage from a differently polarized diode or even from a different transformer winding. The bias provided by the diode 21 is set by the adjustable resistor 24 to a minimum level permitting conduction of the collector current in transistor 10 suitable for the lowest level signals to be received and only a minimum amount of collector current flows when only low signals are being received. The resistor 24 may be utilized as the volume control for the receiver. However, for stronger, higher voltage signals the carrier voltage rises, increasing the bias on the base 11 of the transistor 10 thereby increasing the collector current. The increased collector current is necessary for the stronger signals to prevent the transistor 10 from going into cut-off. The minimum bias provided by the diode 21 is necessary to prevent cut-off, thus the amplifier provides a low energy dissipation at low levels of input signal and high energy dissipation only at the time that higher level signals are being received since the AGC network will in a conventional manner control the carrier voltage to a maximum level. The amplifier will in effect be clamped at a maximum level by the normal action of the AGC. The maximum bias level is also obviously adjustable with the level control pot 24 for the most suitable listening volume.

The foregoing circuit is particularly applicable to integrated circuit techniques since the AGC can be made to effectively go up to a particular level and then clamp to protect the output transistor from destructive current levels.

Figure 2:
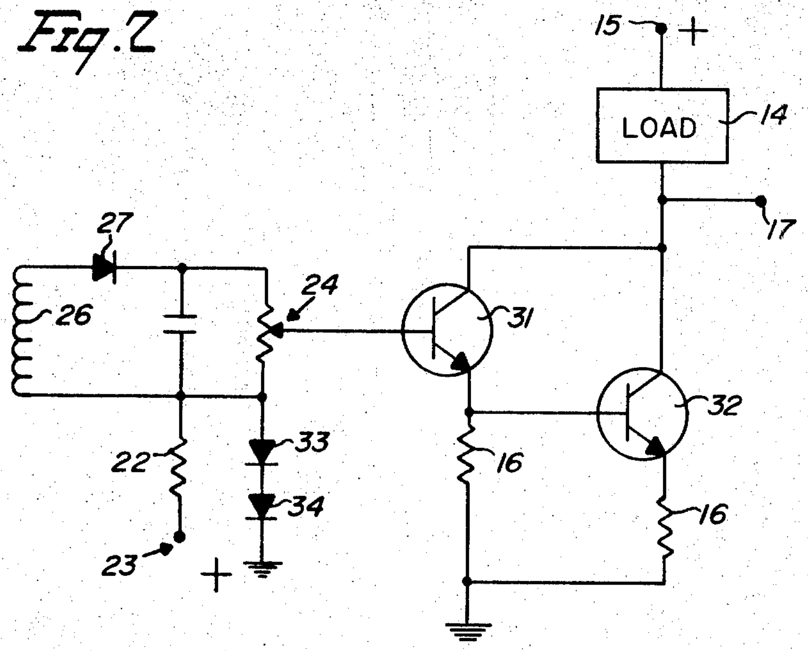

Another embodiment of the invention is depicted in FIG. 2 wherein like parts are labelled with like numbers. In this embodiment the output amplifier includes a Darlington pair of transistors 31 and 32 and the base biasing supply comprises a pair of diodes 33 and 34 to set the minimum bias level of the output amplifier. The carrier voltage from the detector 25 operates as previously stated to increase the collector currents of the transistors 31 and 32 to prevent cut-off thereof at higher signal levels.

The foregoing invention not only saves in the dissipation of power in the circuit to increase its economy of operation but additionally has the advantage of increasing the useful life of the output transistor since the decreased collector currents will lower the temperature of operation of the transistor and it is well recognized that operation at lower temperature of semiconductor devices greatly increases their useful life.

Further objects and advantages of the invention will be apparent to one skilled in the art and several modifications may be made therein without departing from the spirit and scope of the invention.

I claim:

1. A variably biased audio amplifier comprising:

a. a transistor having a base, emitter, and collector with a collector-emitter circuit defining means for deriving an output signal from the amplifier;

b. a detector circuit for receiving a carrier signal modulated by an audio signal and providing said audio signal and the DC component resulting from the detection of the carrier signal;

c. a variable resistor directly connected to said detector circuit for receiving thereacross the audio signals and the DC component and having a variable arm;

d. minimum biasing means connected to said variable resistor for establishing a minimum operating current level for said transistor; and e. said variable arm of said variable resistor being connected directly to the base of said transistor for applying the audio signal directly to the audio amplifier and for utilizing the DC component as a variable bias.

2. A variably biased audio amplifier as set forth in claim 1 wherein said minimum biasing means includes a diode.

3. A variably biased AC amplifier comprising:

a. a transistor having a base, emitter, and collector with a collector-emitter circuit defining means for deriving an output signal from the amplifier;

b. means for providing an AC signal and a DC component;

c. a variable resistor directly connected to said signal providing means for receiving thereacross the AC signals and the DC component and having a variable arm;

d. minimum biasing means connected to said variable resistor for establishing a minimum operating current level for said transistor; and e. said variable arm of said variable resistor being connected directly to the base of said transistor for applying the AC signal directly to the amplifier and for utilizing the DC component as a variable bias.

* * * * *